United States Patent
Lee et al.

(10) Patent No.: US 9,666,827 B2
(45) Date of Patent: May 30, 2017

(54) ORGANIC LIGHT-EMITTING ELEMENT INCLUDING A CONDUCTIVE PATTERN WHICH PASSES THROUGH AN ORGANIC MATERIAL LAYER TO CONNECT TO AN EXTERNAL TERMINAL OF A SECOND ELECTRODE

(75) Inventors: Yeon Keun Lee, Daejeon (KR); Minsoo Kang, Daejeon (KR); Jong-Seok Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 13/816,468

(22) PCT Filed: Aug. 12, 2011

(86) PCT No.: PCT/KR2011/005945
§ 371 (c)(1),
(2), (4) Date: Feb. 11, 2013

(87) PCT Pub. No.: WO2012/021024
PCT Pub. Date: Feb. 16, 2012

(65) Prior Publication Data
US 2013/0140550 A1    Jun. 6, 2013

(30) Foreign Application Priority Data

Aug. 13, 2010  (KR) .................. 10-2010-0078193
Aug. 16, 2010  (KR) .................. 10-2010-0078904

(51) Int. Cl.
*H01L 33/36*    (2010.01)
*H01L 51/00*    (2006.01)
(Continued)

(52) U.S. Cl.
CPC .......... *H01L 51/5203* (2013.01); *H01L 33/36* (2013.01); *H01L 51/0011* (2013.01);
(Continued)

(58) Field of Classification Search
None
See application file for complete search history.

(56) References Cited

U.S. PATENT DOCUMENTS 6,624,572 B1 *    9/2003   Kim et al. ................. 313/512
2003/0045016 A1 * 3/2003   Saito et al. .................. 438/29
(Continued)

FOREIGN PATENT DOCUMENTS

EP    1970960 A2     9/2008
JP    2004-327148 A  11/2004
(Continued)

OTHER PUBLICATIONS

Written Search Report dated Feb. 28, 2012.
Korean Office Action dated Dec. 4, 2012.

*Primary Examiner* — Michael Jung
*Assistant Examiner* — Jay C Chang
(74) *Attorney, Agent, or Firm* — Dentons US LLP

(57) ABSTRACT

The present invention relates to an organic light-emitting element and a production method thereof. Specifically, the present invention relates to an organic light-emitting element, which has excellent productivity during mass production thereof and may allow simplification of vapor deposition equipment, and the like, and a production method thereof.

7 Claims, 5 Drawing Sheets

(51) Int. Cl.
  *H01L 51/52*  (2006.01)
  *H01L 51/56*  (2006.01)

(52) U.S. Cl.
  CPC ...... *H01L 51/5209* (2013.01); *H01L 51/5225* (2013.01); *H01L 51/56* (2013.01); *H01L 2251/5361* (2013.01)

(56) References Cited

U.S. PATENT DOCUMENTS

| | | | |
|---|---|---|---|
| 2004/0014106 A1* | 1/2004 | Patno et al. | 435/6 |
| 2004/0245920 A1* | 12/2004 | Nakamura | 313/504 |
| 2005/0258436 A1* | 11/2005 | Arai | 257/81 |
| 2007/0171148 A1* | 7/2007 | Cassidy | 345/49 |
| 2008/0088227 A1* | 4/2008 | Lee | 313/504 |
| 2010/0237373 A1* | 9/2010 | Yamazaki | H01L 51/52 257/98 |
| 2010/0243997 A1 | 9/2010 | Shimoji | |
| 2010/0314629 A1* | 12/2010 | Tarui | H01L 29/0615 257/77 |

FOREIGN PATENT DOCUMENTS

| | | |
|---|---|---|
| JP | 2006-012993 A | 1/2006 |
| JP | 2006-12993 A | 1/2006 |
| JP | 2007-073353 A | 3/2007 |
| JP | 2008-300332 A | 12/2008 |
| JP | 2008-311059 A | 12/2008 |
| KR | 10-2000-0035710 A | 6/2000 |
| KR | 2006-0101086 | 10/2006 |
| KR | 10-2008-0084610 A | 9/2008 |

* cited by examiner

ORGANIC LIGHT-EMITTING ELEMENT INCLUDING A CONDUCTIVE PATTERN WHICH PASSES THROUGH AN ORGANIC MATERIAL LAYER TO CONNECT TO AN EXTERNAL TERMINAL OF A SECOND ELECTRODE

This application is a national stage application of PCT/KR2011/005945, filed Aug. 12, 2011, which claims priority to and the benefit of Korean Patent Application No. 10-2010-0078193, filed in the Korean Intellectual Property Office on Aug. 13, 2010, and Korean Patent Application No. 10-2010-0078904, filed in the Korean Intellectual Property Office on Aug. 16, 2010, the entire contents of which are incorporated herein by reference.

TECHNICAL FIELD

The present invention relates to an organic light-emitting element and a production method thereof. Specifically, the present invention relates to an organic light-emitting element, which has excellent productivity for mass production thereof and may allow simplification of vapor deposition equipment and the like, and a production method thereof.

BACKGROUND ART

An organic light-emitting element is composed of two opposing electrodes and organic material thin films of a plurality of layers having semiconductor-like properties interposed therebetween. The organic light-emitting element having the configuration uses a phenomenon in which electric energy is converted into light energy by using an organic material, that is, an organic light emission phenomenon. Specifically, when voltage is applied between two electrodes in a structure in which an organic material layer is disposed between an anode and an electrode, holes from the anode and electrons from the cathode are injected into the organic material layer. When the injected holes and electrons meet each other, an exciton is formed, and the exciton falls down to a bottom state to emit light.

In the aforementioned organic light-emitting element, light generated from the organic material layer is emitted through a light transmissive electrode, and the organic light-emitting element may be typically classified into a top emission type, a bottom emission type, and a double-sided emission type. In the case of the top emission or bottom emission type, one of two electrodes needs to be a light transmissive electrode, and in the case of the double-sided emission type, both the two electrodes needs to be a light transmissive electrode.

In respect to the aforementioned organic light-emitting element, many studies have been conducted since Kodak Co., Ltd. announced that when a multilayer structure is used, the element may be driven at a low voltage, and recently, a natural color display using an organic light-emitting element is attached to a mobile phone and commercialized.

Further, as recent studies on the organic light-emitting element using a phosphorescent material instead of a fluorescent material in the related art have been conducted, efficiency has been rapidly improved, and it is also expected that the element would be able to replace an illumination in the related art in the near future.

In order to use the organic light-emitting element as illumination, the element needs to be driven with high brightness unlike the natural color display in the related art, and a constant brightness needs to be maintained like the illumination in the related art. In order to sufficiently improve the brightness of the organic light-emitting element, light emission needs to be implemented in a large area, and in order to implement light emission in the large area, a high driving current needs to be used. In addition, in order to maintain constant brightness in the large area, the aforementioned high current needs to be uniformly injected into the element having the large area.

In general, an organic light-emitting element for illumination has a structure in which a transparent electrode, an organic material layer, and a metal electrode are sequentially deposited on a substrate. When the organic light-emitting element is produced, the organic material layer and the deposition pattern of the metal electrode have different areas on a plan view, and thus different masks are used when the organic material layer and the metal electrode are deposited. Accordingly, there are problems in that it is necessary to replace the mask during the deposition process, productivity is not high due to complex vapor deposition equipment, and production costs are also high.

Currently, a generally-used cluster type deposition apparatus includes a mask for an organic material layer or a mask for a metal electrode per deposition chamber, and when a substrate is introduced into the deposition chamber, the mask and the substrate are combined and then an organic material or metal is deposited thereon. In the process, the number of masks only increases proportionally to the number of deposition chambers. In such a mode, a time for transferring the substrate, a time for combining the substrate and the mask, a time for depositing the organic material or metal and the like, are required, and thus there is a limitation on improving productivity.

On the contrary, in the case of in-line vapor deposition equipment, most of the preparation processes may be omitted, and thus an opportunity to improve productivity is inevitable. However, there is a problem in that even the in-line vapor deposition equipment needs the number of masks that is equal to or more than the number of all the substrates that are inputted into the deposition chamber and on which deposition is performed. When an organic material deposition pattern and an inorganic material deposition pattern are different from each other, the number of masks required needs to be double or more the number of substrates. Furthermore, while the organic material deposition process is changed into the metal electrode deposition process during the in-line process, a mask replacement process is needed, and productivity may be reduced during the procedure.

In order to implement mass production of an organic light-emitting element for illumination in the future, there is a need for a study that may increase productivity of an organic light-emitting element without a mask replacement process in the in-line vapor deposition equipment.

DETAILED DESCRIPTION OF THE INVENTION

Technical Problem

The present invention has been made in an effort to provide an organic light-emitting element, which has excellent productivity and may be produced by allowing simplification of vapor deposition equipment, and a production method thereof. In particular, the present invention has been made in an effort to provide an organic light-emitting element, which may increase productivity by decreasing the number of masks required in the in-line process to omit the mask replacement process during the deposition process and may reduce production costs, and a production method thereof.

Technical Solution

An exemplary embodiment of the present invention provides an organic light-emitting element having a structure in which a first electrode, an organic material layer, and a second electrode are sequentially stacked on a substrate, in which a shape of the second electrode is the same as that of the organic material layer.

Another exemplary embodiment of the present invention provides an organic light-emitting element having a structure in which a first electrode, an organic material layer, and a second electrode are sequentially stacked on a substrate, in which an external terminal of the second electrode is provided to be insulated from the first electrode on the substrate, and a conductive pattern that electrically connects the second electrode with the external terminal of the second electrode is provided.

Yet another exemplary embodiment of the present invention provides a method for producing an organic light-emitting element, including: forming a first electrode on a substrate; forming an organic material layer on the first electrode by using a mask; and forming a second electrode on the organic material layer, in which the organic material layer and the second electrode are formed by using the same mask.

Advantageous Effects

In the organic light-emitting element according to the present invention, the shapes of the pattern of the organic material layer and the pattern of the second electrode are same as each other, and thus the same mask may be used without a need to replace the mask when the organic material layer and the second electrode are each formed, and accordingly, productivity of the organic light-emitting element may be increased and production costs may be reduced. Further, when the organic light-emitting element is produced, it is possible to allow simplification of vapor deposition equipment, thereby obtaining an effect of reducing investment costs.

BEST MODE

Figure 1:
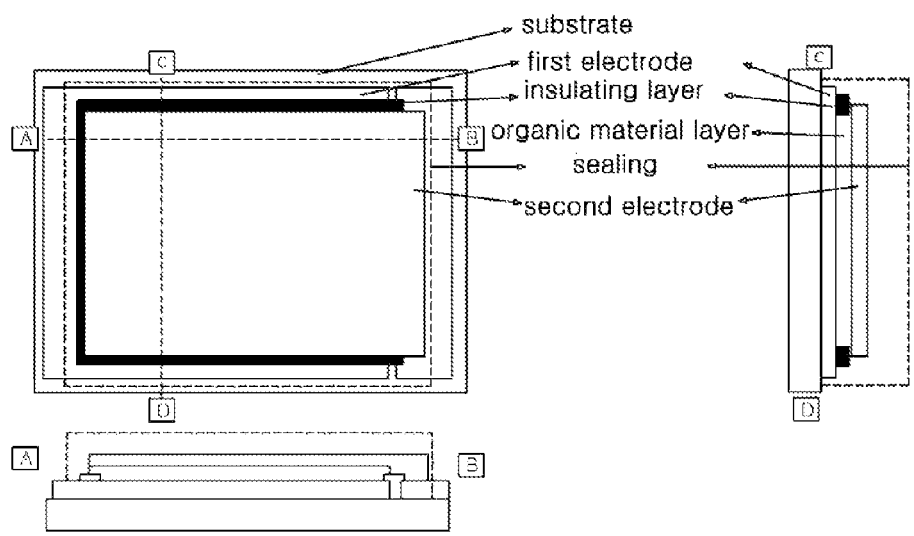
FIG. 1 is a view illustrating a specific example of an organic light-emitting element in the related art.

Hereinafter, the present invention will be described in detail.

An organic light-emitting element according to an exemplary embodiment of the present invention is an organic light-emitting element having a structure in which a first electrode, an organic material layer, and a second electrode are sequentially stacked on a substrate, in which a shape of the second electrode is the same as that of the organic material layer.

In the present specification, the fact that the shape of the second electrode is the same as that of the organic material layer means that the area of the second electrode is the same as that of the organic material layer or has a size difference from that of the organic material layer in a range within 10%, or that the pattern form of the second electrode is the same as that of the organic material layer.

The present invention has a configuration in which the shape of the second electrode is the same as that of the organic material layer, and thus the same mask may be used as a mask for forming the organic material layer and a mask for forming the second electrode.

In the present specification, the area of the organic material layer refers to an area that the organic material layer occupies on the first electrode when the organic material layer is formed on the first electrode, that is, an area when viewed from the top surface side of the second electrode of the element. In addition, the area of the second electrode similarly refers to an area that the second electrode covers the first electrode and the organic material layer, that is, an area when viewed from the top surface side of the second electrode of the element.

In the present specification, the pattern form of the organic material layer refers to a shape that the organic material layer is stacked on the first electrode when the organic material layer is formed on the first electrode, that is, a pattern form when viewed from the top surface side of the second electrode of the element. Furthermore, the pattern form of the second electrode similarly refers to a pattern form that the second electrode covers the first electrode and the organic material layer, that is, a pattern form when viewed from the top surface side of the second electrode of the element.

In the present invention, when the same mask is used as the mask for forming the organic material layer and the mask for forming the second electrode, the area of the second electrode and that of the organic material layer may be the same as each other, but may have a slight difference caused by a forming method, an error in process or the like. However, the same mask is used, and thus the size difference of the area may be in a range within 10%, preferably 5%, and more preferably 3%.

In the present invention, when the same mask is used as the mask for forming the organic material layer and the mask for forming the second electrode, the pattern shapes are the same as each other when the second electrode and the organic material layer are viewed from the top surface side, but as described above, the areas of the second electrode and the organic material layer may be slightly different from each other due to a forming method, an error in process or the like, and thus the aspect ratios of the pattern forms of the second electrode and the organic material layer may be increased or decreased as proportionally to each other.

In the present invention, when the same mask is used, the organic material layer and the second electrode have the same shape and the same area or a difference in areas within a specific range, and are formed in regions that correspond to each other.

In the present invention, the organic light-emitting element may include an external terminal of the second electrode provided to be insulated from the first electrode on the substrate, and a conductive pattern that electrically connects the second electrode with the external terminal of the second electrode.

The external terminal of the second electrode is electrically connected to the second electrode to receive an external voltage. In the present invention, the second electrode and the external terminal of the second electrode may be electrically connected to each other by including the conductive pattern that electrically connects the external terminal of the second electrode with the second electrode.

In order for the organic light-emitting element to emit light, an external voltage needs to be applied on the first electrode and the second electrode. The external voltage may be supplied directly to the first electrode, but the second electrode is electrically connected to a separate external terminal, and then an external voltage is supplied to the separate external terminal.

Figure 3:
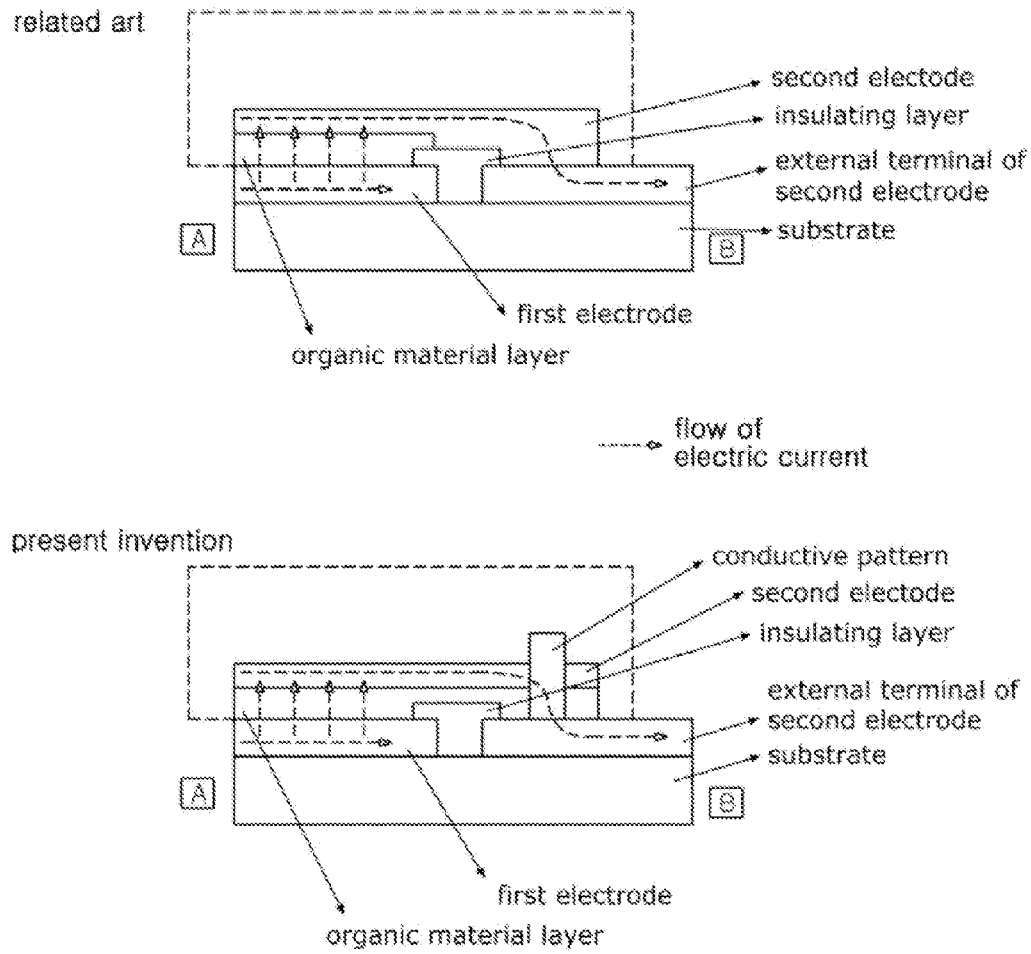
FIG. 3 is a view comparing the flow of electric current in the specific example of the organic light-emitting element in the related art with that in the specific example of the organic light-emitting element according to the present invention.

For electrical connection of the second electrode with the external terminal of the second electrode in the related art, the second electrode is configured to be brought into direct contact with the external terminal of the second electrode, as illustrated in FIG. 3. However, in the case of the configuration, there are problems in that the production process is complex and high costs are required. However, in the present invention, as described above, the electrical connection of the second electrode with the external terminal of the second electrode may be supplemented by the aforementioned conductive pattern while allowing the shape of the organic material layer to be the same as that of the second electrode.

The conductive pattern may have a structure in which the conductive pattern passes through the organic material layer from the top surface of the external terminal of the second electrode to be brought into contact with the second electrode or pass through the second electrode.

Specifically, the organic light-emitting element according to the present invention may include: a substrate; a first electrode provided on the substrate; an external terminal of a second electrode provided to be insulated from the first electrode; an organic material layer provided so as to cover at least a portion of the first electrode and the external terminal of the second electrode; the second electrode provided on the organic material layer and having the same shape as that of the organic material layer; and a conductive pattern having a structure in which the conductive pattern passes through the organic material layer from the top surface of the external terminal of the second electrode to be brought into contact with the second electrode or pass through the second electrode.

In the present invention, for insulation of the first electrode disposed on the substrate from the external terminal of the second electrode, an insulating layer may be provided. The insulating layer is not particularly limited in the material or structure thereof as long as the layer may insulate the first electrode from the external terminal of the second electrode. When the insulating layer is provided, the organic material layer may be provided so as to cover the insulating layer. The insulating layer may be formed of at least one oxide selected from a general photoresist material; polyimide; polyacryl; silicon nitride; silicon oxide; aluminum oxide; aluminum nitride; alkali metal; or fluoride of alkaline earth metal.

An organic light-emitting element according to another exemplary embodiment of the present invention has a structure in which a first electrode, an organic material layer, and a second electrode are sequentially stacked on a substrate, in which an external terminal of the second electrode is provided to be insulated from the first electrode on the substrate, and a conductive pattern that electrically connects the second electrode with the external terminal of the second electrode is provided. The explanation on the external terminal of the second electrode and the conductive pattern is described as above.

In the present invention, an insulating layer may be additionally provided on at least a portion of the outermost part of a region in which the organic material layer is brought into contact with the first electrode. In the present invention, it is unlikely that the first electrode and the second electrode are electrically connected so as to cause a short, but it is further unlikely that the two electrodes are electrically connected by providing an insulating layer therebetween. The insulating layer may be formed of at least one oxide selected from a general photoresist material; polyimide; polyacryl; silicon nitride; silicon oxide; aluminum oxide; aluminum nitride; alkali metal; or fluoride of alkaline earth metal. The thickness of the insulating layer may be from 10 nm to 10 μm, but is not limited thereto.

A specific example of an organic light-emitting element in the related art is illustrated in FIG. 1.

As illustrated in FIG. 1, the organic light-emitting element in the related art includes a first electrode provided on a substrate, an organic material layer, and a second electrode, and the second electrode is brought into direct contact with an external electrode of the second electrode, and thus an external voltage is supplied thereto. That is, in the organic light-emitting element in the related art, the surface of the external terminal of the second electrode needs to be brought into direct contact with the second electrode, so that the second electrode and the external terminal of the second electrode are electrically connected to each other. In other words, an organic material layer need not be deposited at a position corresponding to the external terminal of the second electrode. As a result, the sizes of areas of the organic material layer and the deposition pattern of the second electrode on a plan view are inevitably different from each other.

Figure 2:
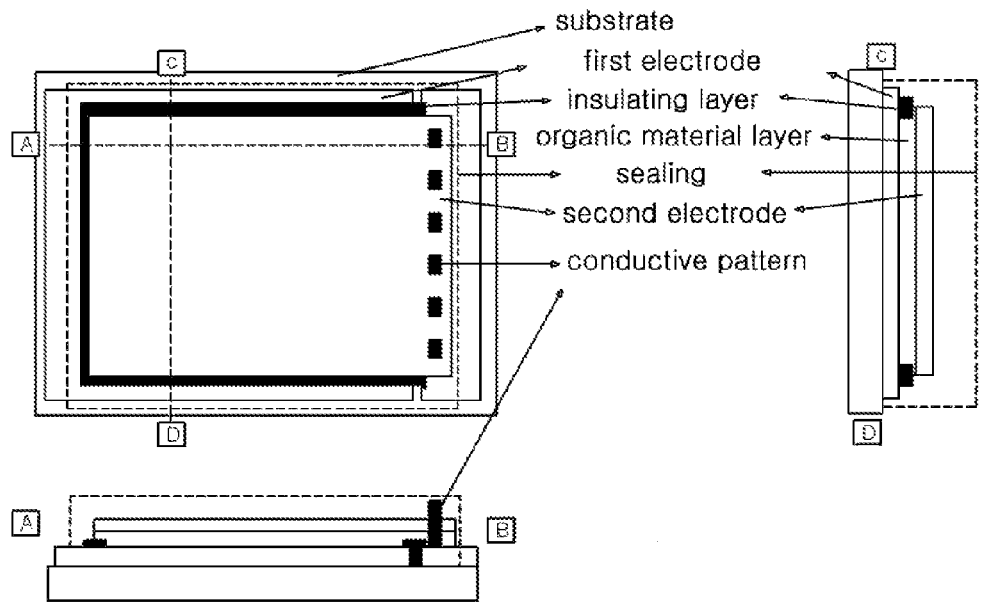
FIG. 2 is a view illustrating a specific example of an organic light-emitting element according to the present invention.

Meanwhile, a specific example of the organic light-emitting element according to the present invention is illustrated in FIG. 2.

As illustrated in FIG. 2, the organic light-emitting element according to the present invention includes a first electrode on a substrate, an organic material layer, and a second electrode, in which the areas of the organic material layer and the pattern of the second electrode are the same as each other. In the organic light-emitting element according to the present invention, the second electrode may be electrically connected with the external terminal of the second electrode through a conductive pattern formed on the external terminal of the second electrode, even though the deposition areas of the organic material layer and the second electrode layer are the same as each other.

The conductive pattern may be formed before an organic material layer is formed on the top surface of the external terminal of the second electrode. The conductive pattern may be formed in a region, in which the second electrode is to be formed, on the top surface of the external terminal of the second electrode before the organic material layer and the second electrode are formed.

Figure 4:
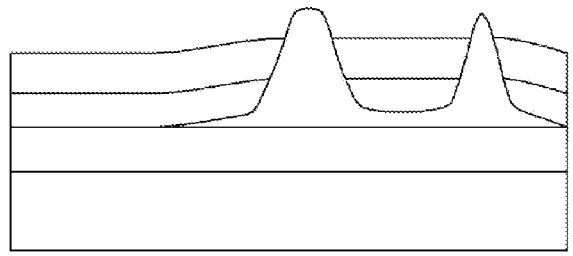
FIGS. 4 and 5 are views illustrating a specific example of various forms of a conductive pattern in the organic light-emitting element according to the present invention.
Figure 5:
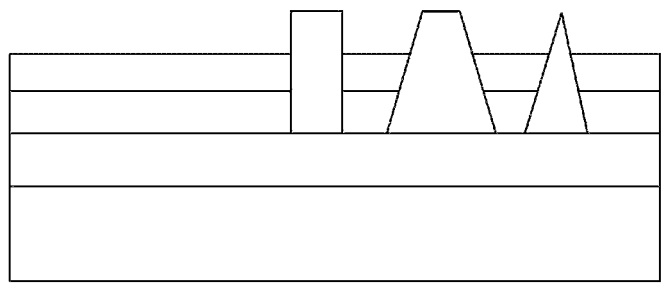

When viewed from the top surface side of the substrate, various forms are possible as the conductive pattern. As explained above, in a region in which the conductive pattern is to be formed, the conductive pattern may be made as one figure form, and may be distributed as a form of a plurality of independent or interconnected points. The transverse cross sectional shape of the conductive pattern is not particularly limited, and may be any shape, such as a triangular shape, a square shape, an amorphous shape and the like. Further, the side surface shape of the conductive pattern may be a square shape or a rectangular shape, but may have a lozenge-shape, a triangular shape or other modified shapes. Various shapes of the conductive pattern are illustrated in FIGS. 4 and 5.

Figure 6:
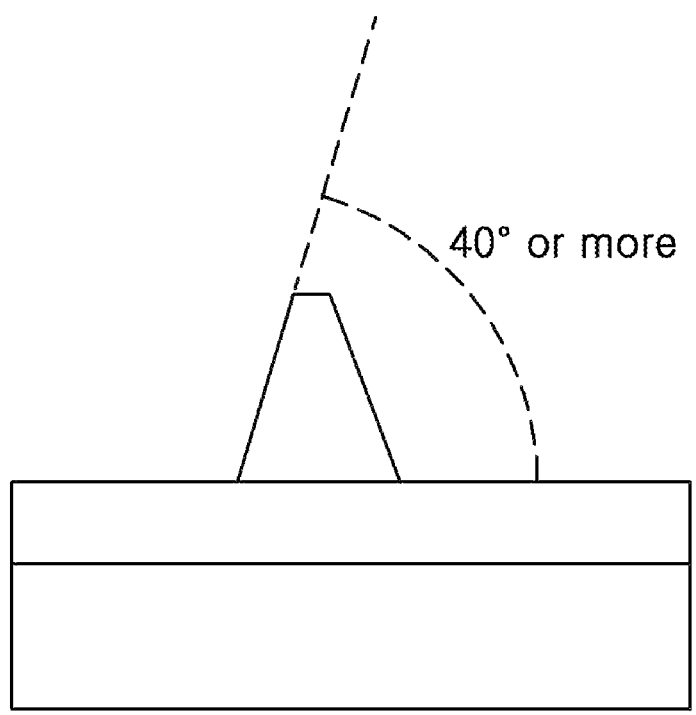
FIG. 6 is a view illustrating a specific example of an angle between the conductive pattern and an external terminal plane of a second electrode in the organic light-emitting element according to the present invention.
Figure 7:
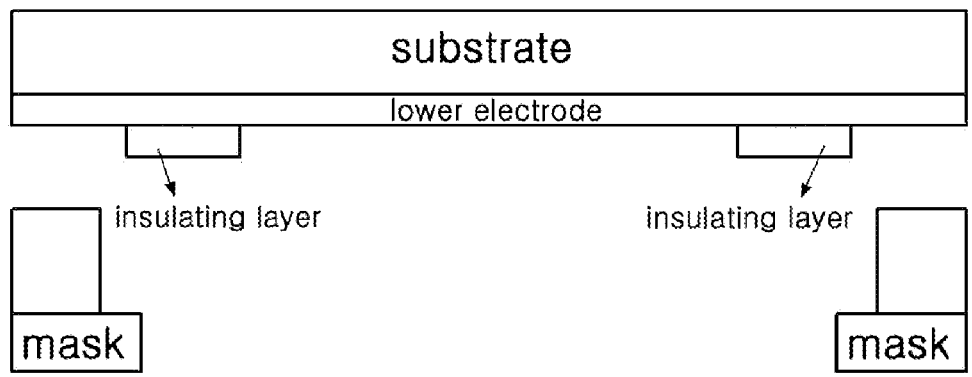
FIGS. 7 to 10 are views illustrating a process of forming an organic material layer and an upper electrode with one mask according to the present invention.
Figure 8:
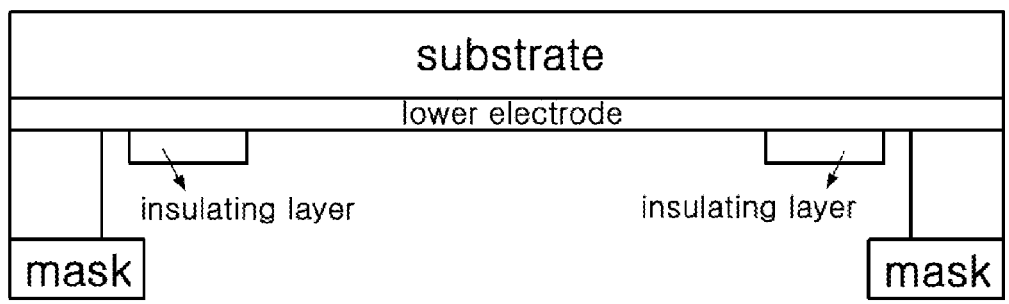
Figure 9:
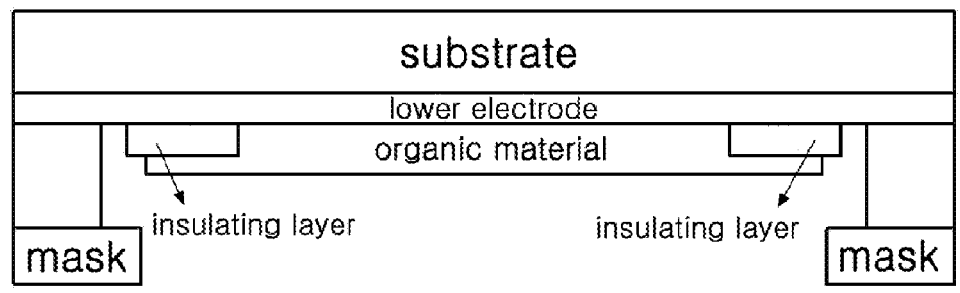
Figure 9:
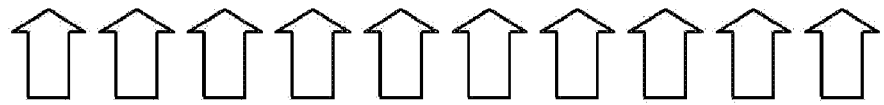
Figure 10:
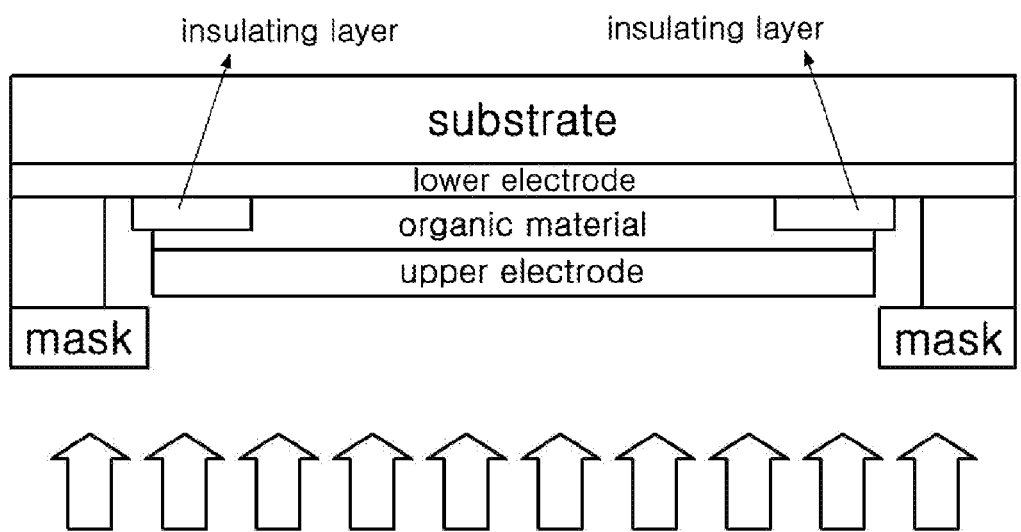

In the side surface shape of the conductive pattern, the maximum angle of the conductive pattern with the top surface of the external terminal of the second electrode is very important. The maximum angle is preferably 40° or more. Even when the organic material layer is formed, the organic material is exposed without covering all the side surface of the conductive pattern, and then when the second electrode is formed, the conductive pattern may be electrically connected with the second electrode. A specific example thereof is illustrated in FIG. 6.

In addition, it is preferred that the height of the conductive pattern is twice or more than the thickness of the organic material layer. When the conductive pattern includes two or more patterns, it is preferred that the height of the conductive pattern is twice or more than the thickness of the organic material layer based on the lower height. It is preferred that the height of the conductive pattern is, for example, 1 micrometer or more.

The higher electrical conductivity of the conductive pattern, the better. It is preferred that electrical conductivity is, for example, $1 \times 10^{-4}$ S/m or more.

As a method for forming the conductive pattern, it is also possible to perform etching or use a printing method after a conductive material layer is formed through deposition and the like.

A metal such as aluminum, chromium, copper, silver, gold, molybdenum and the like, or a transparent conductive material such as indium tin oxide (ITO), indium zinc oxide (IZO) and the like, which may be generally deposited, may be pattern deposited by using a mask, or a pattern may be formed by performing deposition on the entire region and then performing partial etching. Furthermore, it is also possible to perform printing by performing patterning with a conductive paste or ink, which includes silver, copper, carbon and the like.

Further, FIG. 3 illustrates comparison of the flow of electric current in a specific example of the organic light-emitting element in the related art with that in a specific example of the organic light-emitting element according to the present invention.

As described above, in the organic light-emitting element according to the present invention, the organic material layer and the second electrode have the same shape, and thus it is not necessary to replace the mask in the process of forming each of the organic material layer and the second electrode, thereby increasing the productivity of the organic light-emitting element. In addition, when the organic light-emitting element is produced, it is possible to allow simplification of vapor deposition equipment, thereby obtaining an effect of reducing investment costs.

In the organic light-emitting element according to the present invention, the first electrode and the second electrode may be an anode and a cathode, respectively, and may also be a cathode and an anode, respectively. As materials for the first electrode and the second electrode, those known in the art may be used, and the same material may also be used. As materials for the first electrode and the second electrode, a metal, a transparent conductive oxide, a conductive polymer or a composite thereof, or a stacked structure may be used.

For example, the first electrode may be a transparent electrode and the second electrode may be a metal electrode, but the electrodes are not limited thereto. Specifically, the first electrode may be formed by depositing ITO and the like, and the second electrode may be formed by depositing Al and the like.

For example, the electrode may be formed of one or more selected from magnesium, calcium, sodium, potassium, titanium, indium, yttrium, lithium, gadolinium, aluminum, platinum, gold, tungsten, tantalum, copper, silver, tin, and lead.

In addition, the first electrode may also be formed of a transparent conductive oxide. Here, the transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al), and lanthanum (La).

The first electrode may be formed by using any one physical vapor deposition (PVD) selected from sputtering, e-beam evaporation, thermal evaporation, laser molecular beam epitaxy (L-MBE), and pulsed laser deposition (PLD); any one chemical vapor deposition selected from thermal chemical vapor deposition, plasma-enhanced chemical vapor deposition (PECVD), light chemical vapor deposition, laser chemical vapor deposition, metal-organic chemical vapor deposition (MOCVD), and hydride vapor phase epitaxy (HVPE); or atomic layer deposition (ALD).

For example, a material for the second electrode may be a transparent conductive oxide. The transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al), and lanthanum (La). Among them, it is preferred that the film is formed of indium tin oxide (ITO) or indium zinc oxide (IZO).

Furthermore, a material for the second electrode may be one or more selected from magnesium, calcium, sodium, potassium, titanium, indium, yttrium, lithium, gadolinium, aluminum, silver, platinum, gold, tungsten, tantalum, copper, tin, and lead.

The second electrode may be formed by using any one physical vapor deposition (PVD) selected from sputtering, e-beam evaporation, thermal evaporation, laser molecular beam epitaxy (L-MBE), and pulsed laser deposition (PLD); any one chemical vapor deposition selected from thermal chemical vapor deposition, plasma-enhanced chemical vapor deposition (PECVD), light chemical vapor deposition, laser chemical vapor deposition, metal-organic chemical vapor deposition (MOCVD), and hydride vapor phase epitaxy (HVPE); or atomic layer deposition (ALD).

The thickness of the second cathode may be from 50 nm to 5 μm, but is not limited thereto.

In the present invention, the external terminal of the second electrode may be formed of a conductive material, and may be formed of the same material as that of the first electrode or the second electrode.

A metal auxiliary electrode may be formed on the first electrode in order to reduce a sheet resistance value. The metal auxiliary electrode may be formed by using a material and a method known in the art. For example, the metal auxiliary electrode may be formed by a photolithography method using Cr, Mo, Cu, Al and the like.

For example, the organic light-emitting element according to the present invention may be produced by depositing a metal or a metal oxide having conductivity, or an alloy thereof on a substrate to form an anode, by using a physical vapor deposition (PVD) method such as sputtering or e-beam evaporation, forming an organic material layer thereon, and then depositing a material, which may be used as the cathode, thereon. In addition to the aforementioned methods, in order to manufacture an organic light-emitting element having a reverse direction structure as described above, the organic light-emitting element may also be produced by sequentially depositing a cathode material, an organic material layer thereon, and an anode material on a substrate.

In the organic light-emitting element according to the present invention, the organic material layer may be produced with fewer layers by a solvent process other than a deposition method, for example, a method, such as spin coating, dip coating, doctor blading, screen printing, inkjet printing, a thermal transfer method or the like, by using various polymer materials.

The organic material layer according to the present invention may have a stacked structure in which the organic material layer includes a light emitting layer, and one or more selected from a hole injection layer, a hole transporting layer, an electron transporting layer, and an electron injection layer.

In the organic light-emitting element according to the present invention, a material capable of forming the hole injection layer is preferably a material having a large work function such that the injection of holes into the organic material layer may be normally facilitated. Specific examples of the hole injection material, which may be used in the present invention, include a metal, such as vanadium, chromium, copper, zinc, and gold, or alloys thereof; a metal oxide, such as zinc oxide, indium oxide, indium tin oxide (ITO), and indium zinc oxide (IZO); a combination of metal and oxide, such as ZnO:Al or $SnO_2$:Sb; an electrically conductive polymer, such as poly(3-methylthiophene), poly [3,4-(ethylene-1,2-dioxy)thiophene] (PEDT), polypyrrole, and polyaniline, and the like, but are not limited thereto.

In the organic light-emitting element according to the present invention, a material capable of forming the electron injection layer is preferably a material having a small work function such that electrons are easily injected into the organic material layer. Specific examples of the electron injection material include a metal, such as magnesium, calcium, sodium, potassium, titanium, indium, yttrium, lithium, gadolinium, aluminum, silver, tin, and lead, or an alloys thereof; a multi-layer structured material, such as LiF/Al or $LiO_2$/Al, and the like, and may use the same material as the hole injection material, but are not limited thereto.

In the organic light-emitting element according to the present invention, a material capable of forming the light emitting layer is a material capable of emitting light in a visible ray region by accepting and recombining holes from the hole transporting layer and electrons from the electron transporting layer, respectively, and is preferably a material having high quantum efficiency for fluorescence or phosphorescence. Specific examples thereof include 8-hydroxyquinoline-aluminum complexes ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene) (PPV)-based polymers; spiro compounds; polyfluorene and rubrene; phosphorescence host CBP[[4,4'-bis(9-carbazolyl)biphenyl]; and the like, but are not limited thereto.

Further, the light emitting material may additionally include a phosphorescent dopant or a fluorescent dopant in order to improve fluorescent or phosphorescent characteristics. Specific examples of the phosphorescent dopant include $Ir(ppy)_3$(tris(2-phenylpyridine) iridium (III)), $F_2Irpic$(bis[2-(4,6,-di-fluorophenyl)pyridinato-N,C-2']irridium picolinate) or the like. As the fluorescent dopant, those known in the art may be used.

In the organic light-emitting element according to the present invention, a material capable of forming the electron transporting layer is a material which may accept electrons from the electron injection layer well and transport the electrons to the light emitting layer, and is suitably a material having high mobility to electrons. Specific examples thereof include Al complexes of 8-hydroxyquinoline; complexes including $Alq_3$; organic radical compounds; hydroxyflavone-metal complexes; and the like, but are not limited thereto.

The thickness of the organic material layer may be from 100 nm to 5 µm, but is not limited thereto. The organic material layer may be formed so as to cover a portion of the insulating layer on the above-described first electrode, but is not limited thereto.

In the present invention, the substrate may be a glass substrate; a plastic substrate; a plastic film; a metal substrate; or a metal film. The thickness of the substrate may be from 10 µm to 10 mm, the thickness of the lower electrode may be from 10 nm to 1 µm, but the thicknesses are not limited thereto.

As described above, in the organic light-emitting element according to the present invention, the organic material layer and the second electrode have the same shape, and thus it is not necessary to replace the mask during the process of depositing each of the organic material layer and the second electrode, thereby increasing the productivity of the organic light-emitting element. In addition, when the organic light-emitting element is produced, it is possible to allow simplification of vapor deposition equipment, thereby obtaining an effect of reducing investment costs.

In particular, the organic light-emitting element according to the present invention may be used as a display element in various display devices and as a illumination device, but may be more preferably applied for illumination.

Yet another exemplary embodiment of the present invention provides a method for producing an organic light-emitting element, including: forming a first electrode on a substrate; forming an organic material layer on the first electrode by using a mask; and forming a second electrode on the organic material layer, in which the organic material layer and the second electrode are formed by using the same mask.

The mask may be formed of a material selected from stainless steel, an invar-based metal, titanium, a copper plate, and plastic. Here, an example of plastic includes a PET film, but is not limited thereto. The thickness of the mask may be from 5 μm to 5 mm, but is not limited thereto.

The method for producing an organic light-emitting element according to the present invention may further include using the mask to form the organic material layer and the second electrode, and then washing the mask. In the method for producing an organic light-emitting element according to the present invention, the mask may be washed after the mask is consecutively used in the forming of the organic material layer and the forming of the second electrode. On the contrary, in the method for producing an organic light-emitting element in the related art, a mask for forming an organic material layer and a mask for forming a second electrode are separately provided, and thus there is a disadvantage in that it is difficult to wash the mask for forming a second electrode, and accordingly, the cost of replacing the mask is increased.

The method for producing an organic light-emitting element according to the present invention may further include forming an external terminal of the second electrode on the substrate. The external terminal of the second electrode may also be formed simultaneously with the first electrode or the same process as that of the first electrode.

In addition, the method for producing an organic light-emitting element according to the present invention may further include forming an insulating layer. The insulating layer may be an insulating layer for insulating the first electrode with the external terminal of the second electrode. Furthermore, the insulating layer may be formed on at least a portion of the outermost part of a region, in which an organic material layer is to be formed, on the first electrode in order to prevent the first electrode and the second electrode from being shorted. Therefore, the forming of the insulating layer may be forming an insulating layer between the first electrode and the external terminal of the second electrode, or on at least a portion of the outermost part of a region in which the organic material layer is brought into contact with the first electrode.

Further, the method for producing an organic light-emitting element according to the present invention may further include forming a conductive pattern on the external terminal of the second electrode. Specifically, the method may further include forming a conductive pattern on at least a portion of a region, in which the organic material layer and the second electrode are formed, on the top surface of the external terminal of the second electrode before the organic material layer and the second electrode are formed.

In the method for producing an organic light-emitting element according to the present invention, the second electrode is formed by using the mask for forming an organic material layer without separately using the mask for forming a second electrode, and thus a replacement line for replacing the two kinds of masks may be removed and a mask charging part in the related art may be removed, thereby providing simplification of equipment.

In the case of the method in the related art, which separately uses masks in the forming of the organic material layer and the forming of the second electrode, a time for arranging the substrate and the masks is additionally required, but in the method for producing an organic light-emitting element according to the present invention, the two steps may be performed by using one mask, thereby reducing the process time than in the related art.

In addition, in the case of the method in the related art, which separately uses masks in the forming of the organic material layer and the forming of the second electrode, an additional module for the production device, such as a separate chamber for each mask, a replacement device unit of a mask, a washing device of the mask and the like, needs to be provided, but in the method for producing an organic light-emitting element according to the present invention, the forming of the organic material layer and the forming of the second electrode may be performed by using one mask, and thus the additional module is not required, thereby simplifying the production device of the organic light-emitting element.

Furthermore, it is easy to wash the mask consecutively used in the forming of the organic material layer and the forming of the second electrode, and thus the mask may be used for a prolonged time and the costs of replacing the mask may be reduced. Further, according to the present invention, it is possible to allow simplification of equipment, reduce the costs of replacing the mask, and reduce the process time.

The invention claimed is:

1. An organic light-emitting element having a structure in which a first electrode, an organic material layer, a second electrode are sequentially stacked on a substrate, an external terminal of the second electrode provided to be insulated from the first electrode on the substrate, and a conductive pattern that electrically connects the second electrode with the external terminal of the second electrode,
   wherein a shape of the second electrode is the same as that of the organic material layer,
   wherein an upper side area of the second electrode is the same as that of the organic material layer or has a size difference from that of the organic material layer in a range within 10%,
   wherein the conductive pattern has a structure in which the conductive pattern passes through the organic material layer from a top surface of the external terminal of the second electrode to be brought into contact with the second electrode or pass through the second electrode, and the conductive pattern is disposed inside the organic material layer such that it is completely surrounded by the organic material layer in a plan view, and
   wherein the first electrode and the external terminal of the second electrode are directly provided on the same surface of the substrate.

2. The organic light-emitting element of claim 1, wherein the upper side area of the second electrode is the same as that of the organic material layer.

3. The organic light-emitting element of claim 1, wherein a maximum angle between a side surface shape of the conductive pattern and the top surface of the external terminal of the second electrode is 40° or more.

4. The organic light-emitting element of claim 1, wherein a height of the conductive pattern is twice or more than a thickness of the organic material layer.

5. The organic light-emitting element of claim 1, wherein an insulating layer is provided between the first electrode and the external terminal of the second electrode.

6. The organic light-emitting element of claim 1, wherein an insulating layer is additionally provided on at least a portion of an outermost part of a region in which the organic material layer is brought into contact with the first electrode.

7. The organic light-emitting element of claim 1 is for illumination.

* * * * *